United States Patent
Cadien et al.

(10) Patent No.: US 6,358,853 B2
(45) Date of Patent: *Mar. 19, 2002

(54) CERIA BASED SLURRY FOR CHEMICAL-MECHANICAL POLISHING

(75) Inventors: Kenneth C. Cadien; Allen D. Feller; Mark Buehler, all of Portland; Paul Fischer, Hillsboro, all of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,370

(22) Filed: Sep. 10, 1998

(51) Int. Cl.$^7$ .............................................. H01L 21/302
(52) U.S. Cl. .................... 438/692; 252/79.1; 252/79.3; 252/79.4; 52/308
(58) Field of Search ........................ 438/692; 252/79.1, 252/79.3, 79.4; 51/308

(56) References Cited

U.S. PATENT DOCUMENTS

| | | | | |
|---|---|---|---|---|
| 5,993,686 A | * | 11/1999 | Streinz et al. | 252/79.3 |
| 6,019,806 A | * | 2/2000 | Sees et al. | 51/308 |
| 6,063,306 A | * | 5/2000 | Kaufman et al. | 252/79.4 |
| 6,068,787 A | * | 5/2000 | Grumbine et al. | 252/79.1 |

OTHER PUBLICATIONS

Kudryavtseva, N.L. et al., "Test of Polisher Powder Compounds," Sov. J. Opt. Technol. 46(4), Apr. 1979, pp. 223–224.

Homma, Y. et al., "Selective CMP of Organic SOG for Low Parasitic Capacitance Quarter–Micron Multilevel Interconnections," 1996 CMP–MIC Conference, Feb. 22–23, 1996, pp. 67–73.

Pohl, Michael C. and Griffiths, Duncan A., "The Importance of Particle Size to the Performance of Abrasive Particles in the CMP Process," Journal of Electronic Materials, vol. 25, No. 10, Jul. 1996, pp. 1612–1616.

Nojo, H. et al., "Slurry Engineering for Self–Stopping Dishing Free SIO$_2$–CMP," White paper, Semiconductor Manufacturing Engineering Center, Toshiba Corporation, Dec. 1996, 4 pages.

* cited by examiner

Primary Examiner—Michael Lebentritt
Assistant Examiner—Pho Luu
(74) Attorney, Agent, or Firm—Blakely, Sokoloff, Taylor & Zafman LLP

(57) ABSTRACT

A ceria based abrasive is used in a chemical mechanical polishing operation at low polish pressure, and a predetermined pH range, to achieve high polish rates and good uniformity when planarizing layers formed from low dielectric constant materials, including but not limited to polymers. The distribution of ceria particle sizes in an exemplary slurry is bimodal and controlled.

In a particular embodiment a polishing abrasive containing a controlled distribution of ceria particle sizes is used in a CMP polisher apparatus with a polishing pressure of approximately 3 psi and a pH of approximately 10.6 to planarize polymer films.

5 Claims, 3 Drawing Sheets

CERIA BASED SLURRY FOR CHEMICAL-MECHANICAL POLISHING

BACKGROUND OF THE INVENTION

1. Field of the Invention

The present invention relates to the field of planarization, and more specifically, to ceria based abrasives for chemical-mechanical polishing (CMP).

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as silicon dioxide. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

A consequence of having multiple layers of patterned conductive material separated by an insulating layer is the formation of undesired capacitors. The parasitic capacitance between patterned conductive material, or more simply, interconnects, separated by insulating material on microelectronic devices contributes to effects such as RC delay, power dissipation, and capacitively coupled signals, also known as cross-talk.

One way to reduce the unwanted capacitance between the interconnects is to use an insulating material with a lower dielectric constant. Recently, polymers have been introduced for use in integrated circuit manufacturing as dielectrics having a lower dielectric constant than conventionally used oxides of silicon.

Nonplanar surfaces, when present in integrated circuits having complex, high density multilevel interconnections, may cause the optical resolution of photolithographic processing steps to be poor, which could inhibit the printing of high density lines. Another problem that may be caused by nonplanar surface topography relates to step coverage of metal layers. If steps are too high or uneven, open circuits could be created. It is thus important, when making such complex integrated circuits, to planarize the surface of many of the layers that make up the device.

Various techniques have been developed to planarize certain layers formed during the process of making integrated circuits. In one approach, known as chemical-mechanical polishing, protruding steps, such as those that may be formed along the upper surface of interlayer dielectrics ("ILDs"), are removed by polishing. Chemical-mechanical polishing may also be used to planarize conformally deposited metal layers to form planar plugs or vias.

Accordingly, there is a need for CMP methods and apparatus to polish low dielectric constant materials such as polymers.

SUMMARY OF THE INVENTION

Briefly, a ceria based slurry is used in a chemical mechanical polishing operation at low polish pressure, and a predetermined pH range, to achieve high polish rates and good uniformity when planarizing films formed from low dielectric constant materials, such as polymers.

In a further aspect of the present invention, the distribution of ceria particle sizes in a slurry is bimodal, that is, controlled such that there are two distinct particle size ranges.

In a particular, exemplary embodiment of the present invention, a ceria based polishing slurry containing a bimodal distribution of ceria particle sizes is used in a CMP polisher apparatus with a polishing pressure of approximately 3 psi and a pH of approximately 10.6 to planarize fluorinated organic polymers.

DETAILED DESCRIPTION

Figure 1:
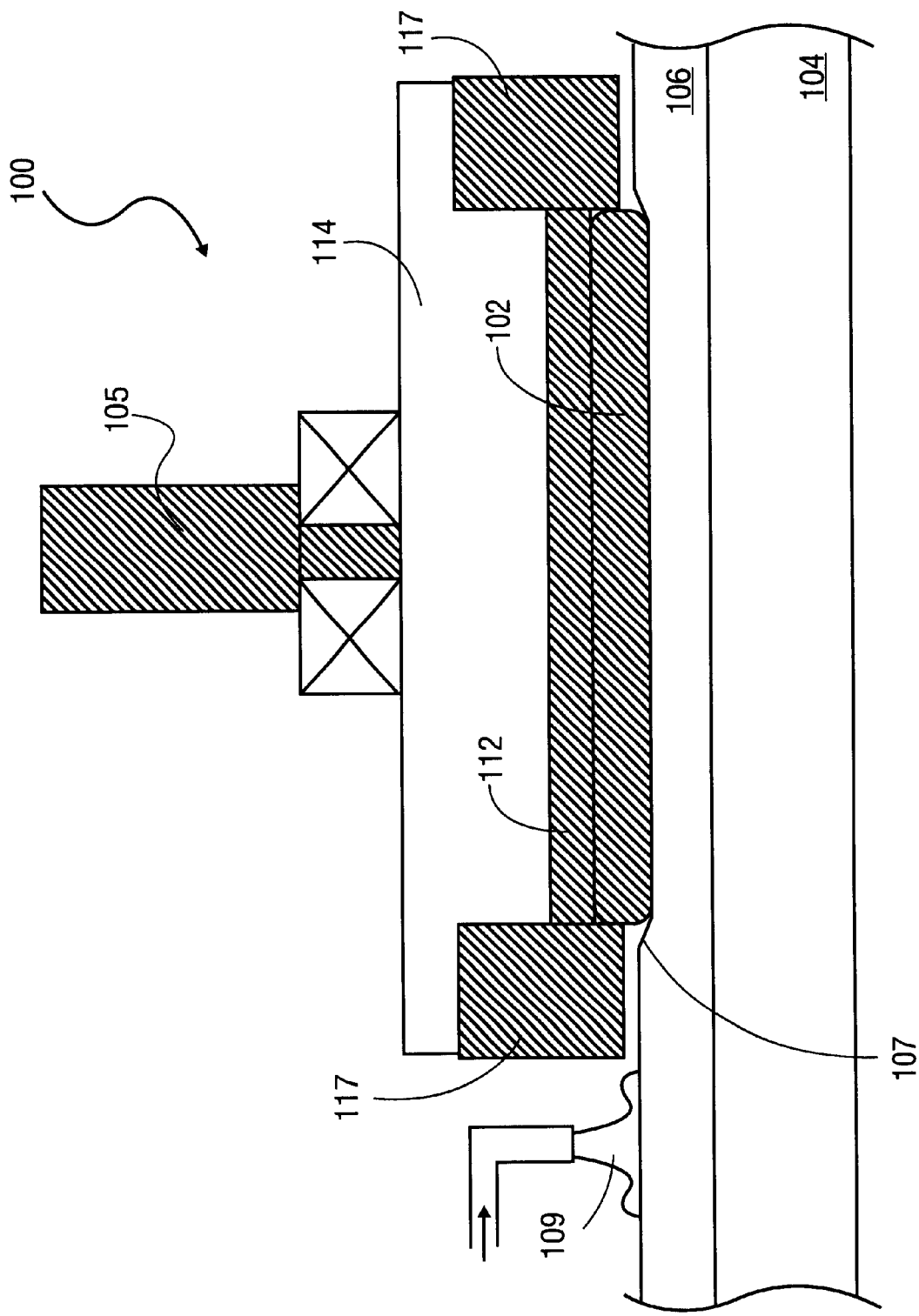
FIG. 1 is a cross-sectional view of a CMP apparatus using a convex solid to bend a wafer, and a conventional retaining ring.

An improved method and apparatus for the chemical-mechanical polishing of thin films formed on a substrate is described. In the following description numerous specific details are set forth to provide an understanding of the present invention. It will be apparent, however, to those skilled in the art and having the benefit of this disclosure, that the present invention may be practiced with apparatus and processes that vary from those specified here.

Terminology

Substrate, as used herein, refers to the physical object that is to be planarized by means of the CMP process. A substrate may also be referred to as a wafer. Wafers, may be made of semiconducting, non-semiconducting, or combinations of semiconducting and non-semiconducting materials. Silicon wafers may have thin films of various materials formed upon them. These thin films may be planarized with CMP processing. Other substrate materials such as GaAs, silicon-on-sapphire, or silicon on insulator (SOI) may be planarized with CMP processing.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The expression, low dielectric constant material, refers to materials having a lower dielectric constant than oxides of silicon.

The term vertical, as used herein, means substantially orthogonal to the surface of a substrate.

RPM (also rpm) refers to revolutions per minute.

Overview

Ceria is an oxide of the rare earth element Cerium (Ce) and is often referred to by the chemical formula $CeO_2$. Ceria has been used for glass polishing applications such as lens and mirror manufacturing in the past. Ceria is typically mined, and is commercially available as a powder wherein the particles have rough edges.

Polishing with relatively large, rough-edged ceria particles provides a fast polish, that is, a high polishing rate, but results in scratches on the surface being polished. On the other hand, polishing with relatively small ceria particles reduces the scratching problem but also reduces the polish rate to such an extent that polishing with these small particles is impractical. In some cases of polishing with small ceria particles the polishing process is observed to "shut down", that is, to stop polishing.

In accordance with the present invention, organic polymer dielectrics are subjected to chemical mechanical polishing operations using a slurry that contains a predetermined ratio of ceria particle sizes.

Polymer films, such as those used to form low dielectric constant insulating layers in ICs, are much softer than the oxides of silicon that have been commonly used to form inter-layer dielectrics. When these polymer films are polished in a chemical mechanical polishing operation, with conventional abrasives such as silica and alumina, significant scratching of the polymer film occurs as a result of the softness of the film. Additionally, these organic polymer films tend to be somewhat resistant to chemical attack from water based slurry chemistries.

A slurry in accordance with the present invention is based on ceria rather than the conventional abrasives such as silica or alumina. A ceria based slurry according to the present invention enables high polish rates and substantially reduces scratching of polymer films.

The Slurry

A slurry, in accordance with the present invention, for chemical mechanical polishing of thin films, such as polymer dielectric layers on microelectronic devices, includes ceria particles of at least two size ranges, silica particles, water, and a compound for determining the pH of the slurry.

An example of a slurry in accordance with the present invention includes 1 part of a pre-mixed slurry, (CABOT EP7391-100 (2 wt. % silica, 6.5 wt. % small particle ceria, potassium hydroxide and de-ionized water)), 7 parts de-ionized water, 2 grams/liter large particle ceria, 4 grams/liter potassium carbonate, and 1 gram/liter potassium bicarbonate. Alternatively, large particle ceria can be added in amounts as low as 0.75 grams/liter.

The potassium carbonate and potassium bicarbonate act as pH buffers. This exemplary slurry has a pH of approximately 10.6 and a specific gravity of approximately 1.015. Those skilled in the art will recognize that the slurry may be buffered to other values of pH.

Those skilled in the art and having the benefit of this disclosure will further recognize that it is not necessary to use pre-mixed slurry formulations as part of the present invention. Rather, this example is provided to illustrate the present invention.

Small particle ceria refers to crushed ceria that is filtered to a size of approximately 0.43 microns, such that approximately 99% of the particles are of this size. Large particle ceria refers to crushed ceria that is filtered to a size of approximately 2.8 microns, such that approximately 99% of the particles are of this size. The large ceria particles are typically added to the small particle slurry and mixed with a motor driven stirrer. By combining the materials described above, a slurry is obtained having a predetermined ratio between large and small ceria particles.

Method

Figure 2:
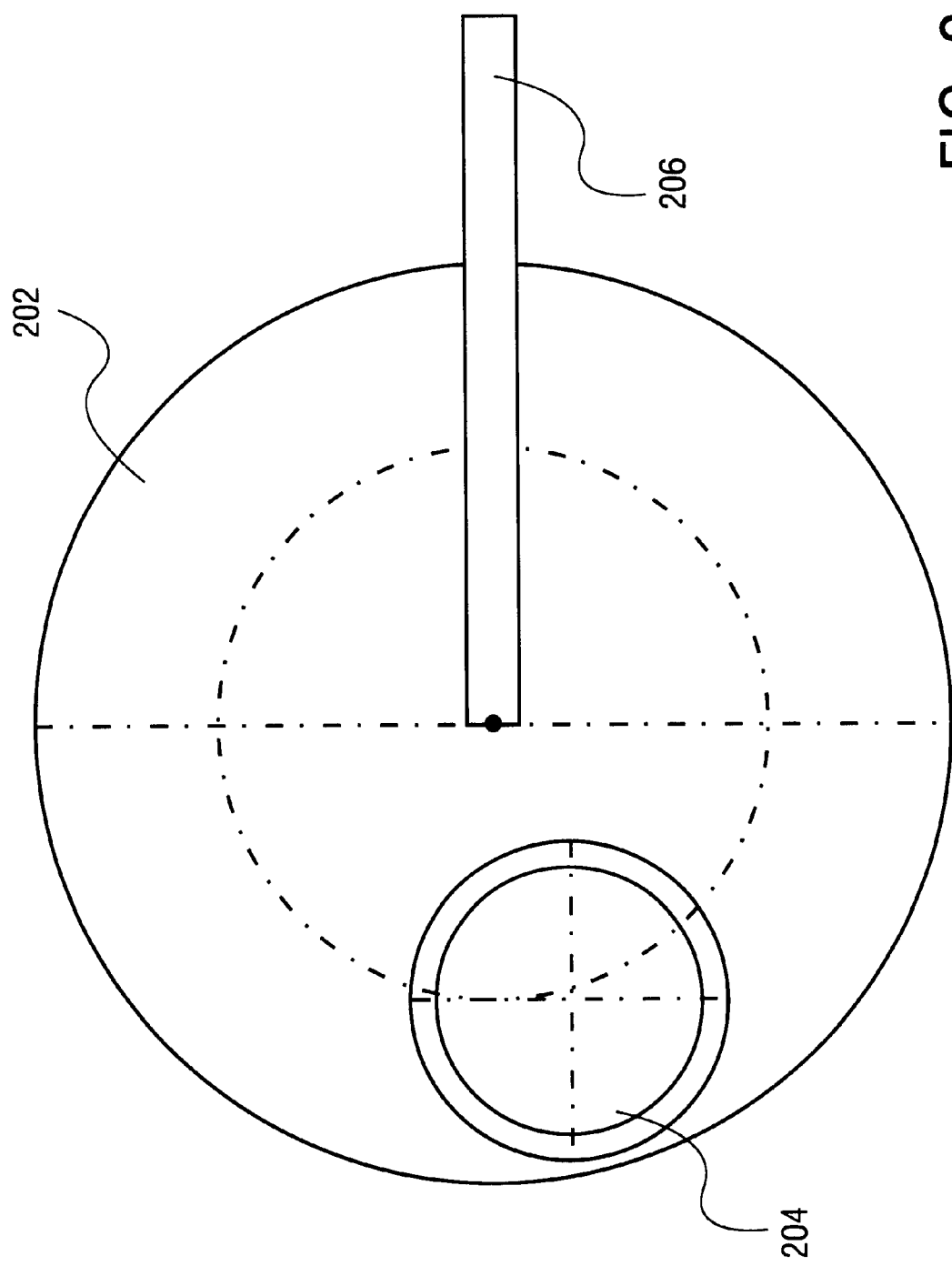
FIG. 2 is a top view of a polishing pad covered platen, retaining ring, and slurry delivery arm, indicating the slurry delivery point to the polishing pad.
Figure 3:
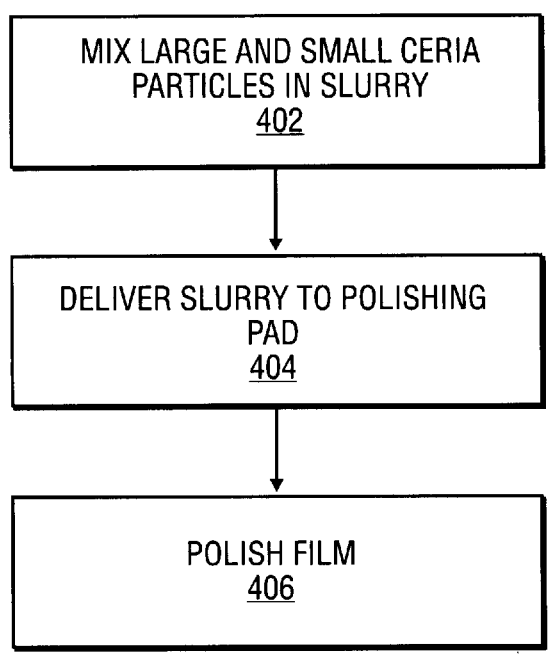
FIG. 3 is a flowchart showing the operations in a process of making a slurry in accordance with the present invention.

An embodiment of the method of polishing a thin film on a wafer containing microelectronic devices, in accordance with the present invention is described in conjunction with FIGS. 1–3.

In a typical CMP system, as shown in FIG. 1, a wafer 102 is placed face down on a rotating table 104 covered with a polishing pad 106, which has been coated with a slurry 108. A carrier 100, which may be made of a thick nonflexible metal plate 114 that is attached to a rotatable shaft 105, is used to apply a downward force against the backside of wafer 102. A retaining ring 117 may be used to center wafer 102 onto carrier 100 and to prevent wafer 102 from slipping laterally. Typically, the surface of wafer 102 extends outwardly beyond the polishing side surface of retaining ring 117. A resilient carrier pad 112 positioned between metal plate 114 and wafer 102, is typically used to press against the backside of wafer 102. Often, plate 114 will be manufactured with a slight convex curvature so as to bend the central portion of a wafer outward. By applying the downward force, and rotating wafer 102, while simultaneously rotating slurry covered pad 106 for a selected amount of time, a desired amount of material may be removed from the upper surface of a thin film such that the surface of wafer 102 is planarized.

FIG. 2 provides a top view of a conventional CMP system, showing polishing pad 202, retaining ring 204, and slurry delivery arm 206. The ceria based slurry of the present invention is typically delivered to the polishing pad through the use of peristaltic pumps.

Although polishing typically takes place in a range of temperatures from about 10° C. to about 25° C., further chilling the pad, slurry, or wafer may improve polymer polishing results. Generally, hard materials polish more easily than soft materials. Polymers tend to be softer than other materials that are routinely planarized by chemical mechanical polishing. Since polymers tend to harden with decreasing temperatures, chilling the polymer film on the wafer will tend to provide a harder surface for polishing.

Although polymer films are described in the illustrative embodiment herein, the ceria based slurry in accordance with the present invention is suitable for polishing any low dielectric constant thin film, including but not limited to fluorine doped oxides of silicon, amorphous fluorinated carbon, parylenes, and PAE (para arol ethylene). Organic polymers used for low dielectric constant insulators in microelectronic devices can be doped with fluorine to further reduce their dielectric constant, and these can also be polished with the ceria based slurry of the present invention.

FIG. 3 shows a flow diagram of a process 400 embodying the present invention. At block 402, a slurry containing two distinct size ranges of ceria is prepared by mixing together large size and small size ceria particles. An exemplary formulation of a slurry in accordance with the present invention is described above in the preceding section. The slurry is then delivered to the polishing pad as shown at block 404. Then, as shown at block 406, a film is polished as a wafer coated with the thin film is brought into contact with a rotating polishing pad onto which the slurry containing large and small ceria particles has been delivered.

Figure 4:
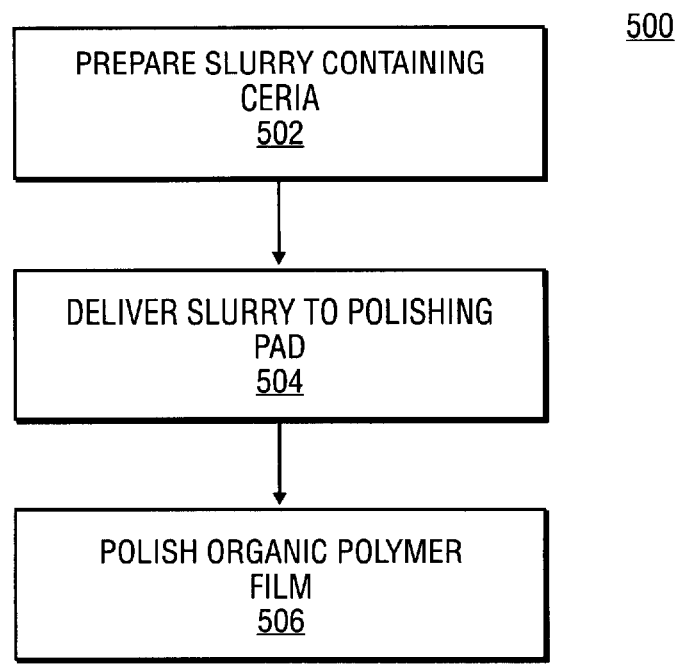
FIG. 4 is a flowchart showing the operations in a process of polishing a thin film in accordance with the present invention.

FIG. 4 shows a flow diagram of an alternative process 500 embodying the present invention. At block 502, a ceria containing slurry is prepared. As shown at block 504, the ceria containing slurry is delivered to, and dispensed onto, a polishing pad. Then, as shown at block 506, an organic polymer film is polished as a wafer coated with the thin organic polymer film is brought into contact with a rotating polishing pad onto which the slurry containing ceria has been delivered. Typical polishing conditions are down force of approximately 3 psi, 180 rpm effective rotational speed, temperature between approximately 10° C. and 25° C. Polishing pads such as the Politex Supreme, and Suba-4, made by Rodel, Inc. of Newark, Del., can be used with the ceria based slurry to polish organic films. Removal rates of greater 2250 angstroms/minute have been obtained when polishing organic material such as parylene.

Conclusion

Embodiments of the present invention provide ceria based slurries for chemical mechanical polishing of thin films, at low pressure and high polish rates. These thin films are typically comprised of materials that are softer than silicon dioxide films. For example, organic polymer thin films are softer than silicon dioxide thin films.

An advantage of some embodiments of the present invention is that the polish time can be reduced thus reducing manufacturing cost.

A further advantage of some embodiments of the present invention is that dishing is reduced when polishing polymer films.

A still further advantage of some embodiments of the present invention is that scratching of polymer films during polishing is reduced.

It will be apparent to those skilled in the art a number of variations or modifications may be made to the illustrative embodiments described above. For example, various combinations of particle sizes, slurry pH, slurry delivery rate, pad rotation speed, pad temperature, and so on, may be used within the scope of the present invention.

Other modifications from the specifically described apparatus, slurry, and process will be apparent to those skilled in the art and having the benefit of this disclosure. Accordingly, it is intended that all such modifications and alterations be considered as within the spirit and scope of the invention as defined by the subjoined claims.

What is claimed is:

1. A slurry, comprising:

a first oxide of cerium having a particle size range wherein approximately 99% of the particles of the first oxide have a size of approximately 0.43 microns; and a second oxide of cerium having a particle size range wherein approximately 99% of the particles of the second oxide have a size of approximately 2.8 microns.

2. The slurry of claim 1, further comprising an oxide of silicon.

3. The slurry of claim 1, further comprising water.

4. The slurry of claim 3, wherein the water is deionized.

5. The slurry of claim 1, further comprising:

silica; potassium hydroxide, potassium carbonate, potassium bicarbonate, and deionized water;

wherein the concentration of the first oxide of cerium together with the second oxide of cerium is in the range of approximately 1.0% to 3.0% by weight;

wherein the concentration of the silica is approximately 0.5% by weight; and wherein the slurry has a pH of approximately 10.6.

* * * * *